(12) United States Patent
Terada et al.

(10) Patent No.: US 7,968,468 B2
(45) Date of Patent: Jun. 28, 2011

(54) SUBSTRATE TREATMENT APPARATUS AND SUBSTRATE TREATMENT METHOD

(75) Inventors: Shouichi Terada, Koshi (JP); Tsuyoshi Mizuno, Koshi (JP); Takeshi Uehara, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 958 days.

(21) Appl. No.: 11/562,909

(22) Filed: Nov. 22, 2006

(65) Prior Publication Data

US 2008/0008835 A1    Jan. 10, 2008

Related U.S. Application Data

(60) Provisional application No. 60/830,120, filed on Jul. 12, 2006.

(30) Foreign Application Priority Data

Nov. 24, 2005 (JP) ................................ 2005-338114
Jul. 4, 2006 (JP) ................................ 2006-183981

(51) Int. Cl.
H01L 21/302 (2006.01)
H01L 21/461 (2006.01)
H01L 21/311 (2006.01)

(52) U.S. Cl. ............ 438/699; 216/97; 216/55; 427/98.8

(58) Field of Classification Search .................... 216/97, 216/55; 438/699; 427/98.8
See application file for complete search history.

(56) References Cited

U.S. PATENT DOCUMENTS

| 4,721,548 A | * | 1/1988 | Morimoto ...................... 438/697 |
| 6,010,963 A | * | 1/2000 | Allman et al. ................. 438/690 |
| 6,271,119 B1 | | 8/2001 | Kishimoto |
| 6,372,414 B1 | | 4/2002 | Redd et al. |
| 6,605,541 B1 | | 8/2003 | Yu |
| 6,683,007 B1 | | 1/2004 | Yamasaki et al. |
| 2001/0033895 A1 | | 10/2001 | Minami et al. |
| 2005/0211267 A1 | | 9/2005 | Kao et al. |

FOREIGN PATENT DOCUMENTS

| JP | 06-097068 | 4/1994 |
| JP | 07-047324 | 2/1995 |
| JP | 08-306877 | 11/1996 |
| JP | 11-329938 | 11/1999 |
| JP | 2002-026016 | 1/2002 |

* cited by examiner

*Primary Examiner* — Roberts Culbert
(74) *Attorney, Agent, or Firm* — Oblon, Spivak, McClelland, Maier & Neustadt, L.L.P.

(57) ABSTRACT

In a substrate treatment method for supplying a coating solution to a substrate with projections and depressions on a front surface thereof to form a coating film on the front surface of the substrate, the coating solution is supplied to the rotating substrate to form a coating film on the front surface of the substrate, and the substrate having the coating film formed thereon is heated to adjust an etching condition of the coating film. Next, the etching solution is supplied to the rotating substrate to etch the coating film, and thereafter the coating solution is supplied to the substrate to form a flat coating film on the front surface of the substrate. Thereafter, the substrate is heated to cure the coating film. This flattens the coating film with uniformity and high accuracy without undergoing a high-load process such as chemical mechanical polishing.

8 Claims, 15 Drawing Sheets

SUBSTRATE TREATMENT APPARATUS AND SUBSTRATE TREATMENT METHOD

BACKGROUND OF THE INVENTION

1. Field of the Invention

The present invention relates to a substrate treatment method and a substrate treatment apparatus and, more specifically, to a substrate treatment method of applying a coating solution to a substrate, for example, a semiconductor wafer, an LCD substrate and the like to form a coating film on the front surface of the substrate and an apparatus therefor.

2. Description of the Related Art

Conventionally, a technology of forming multilayer wiring on the substrate is employed with an increase in integration of semiconductor devices, in which a silicon oxide film-based glass that is referred to as SOG (Spin On Glass) is used as a film for insulating wirings in the multilayer wiring, that is, circuit patterns from each other.

The method of forming the SOG film is generally a method of applying a glass component molten in an organic solvent onto the substrate by a spin-coat method, and drying and burning it by thermal treatment such as baking or curing to bond the glass component thereto, thus forming a film.

However, a circuit pattern with projections and depressions is formed on the front surface of the substrate, and therefore when a typical spin coating method and thermal drying are performed, unevenness in shape of the film surface following the shape of level differences of the projections and depressions occurs, causing problems in subsequent process steps. The problems are, for example, that for lithography, if performed, various poor conditions are caused, such as degradation in line width (CD) due to an increased focal depth, an increase in level difference with stacking of films and so on.

Hence, there is a need to flatten the coating film. As the method of flattening the coating film, a chemical mechanical polishing (CMP) technology is known in which after the coating film is cured by thermal treatment, a polishing solution containing mechanical polishing particles and chemical polishing particles is then dropped onto the surface of a polishing cloth being a polishing member, and the surface of the polishing cloth is pressed against the coating film on the substrate to remove a part of the coating film.

Besides, as another flattening method without undergoing the high-load process such as CMP, a coating method and apparatus are known in which a coating solution is supplied to the substrate surface having an uneven surface so that a coating film is spread out to be thin over the surface of the substrate by a scanner plate, and an air pressure from a nozzle in a slit form is used to evenly press it (see Claims and FIG. 1, FIG. 2, and FIG. 4 in Japanese Patent Application Laid-open No. Hei 7-47324). As still another means, a coating method and apparatus are known in which a coating solution is supplied to the surface of the substrate, a gas containing a solvent vapor is then supplied to thereby make the coating film thin and even (see paragraph number 0142 and FIG. 8 and FIG. 13 in Japanese Patent Application Laid-open No. Hei 11-329938).

SUMMARY OF THE INVENTION

However, the technology described in Japanese Patent Application Laid-open No. Hei 7-47324 has a problem. The problem is that since air is blown to the coating solution, the coating solution evaporates to harden, resulting in a decrease in flowability to fail to sufficiently uniformize the coating film.

In the technology described in Japanese Patent Application Laid-open No. Hei 11-329938, evaporation of the coating solution can be suppressed more as compared to the former technology since the solvent vapor is sent to the coating solution, but the coating solution evaporates to harden as in the former technology due to influence of the surrounding environment in the treatment section, resulting in a decrease in flowability. Accordingly, this technology also has a problem of the coating film being not sufficiently uniformized.

The present invention has been developed in consideration of the above circumstances, and its object is to flatten the coating film with uniformity and high accuracy without undergoing a high-load process such as CMP.

In order to attain the above object, the present invention includes: a first coating step of supplying a coating solution to the substrate with projections and depressions on the front surface thereof to form a coating film on the front surface of the substrate; a first drying step of heating the substrate having the coating film formed thereon to adjust an etching condition of the coating film; an etching step of supplying an etching solution for etching the coating film formed on the substrate to etch the coating film; a second coating step of supplying the coating solution to the substrate to form a flat coating film on the front surface of the substrate; and after the second coating step, a second drying step of heating the substrate to cure the coating film.

According to the present invention, it is possible that after the coating film is formed on the front surface of the substrate with projections and depressions on the front surface, the substrate is heated to adjust the etching conditions of the coating film, such as the etching amount, the etching time, and so on, the etching solution is used to etch the coating film in the etching step so as to remove the excessive film, thereafter the coating solution is supplied again onto the etched coating film to form a flat coating film, and the substrate is heated to cure (bake) the coating film.

After the second drying step, the second coating step and second drying step are repeatedly performed, thereby making it possible to stack the cured coating films one on the other and to further decrease the level difference on the front surface of the coating film. In such a viewpoint, the first coating step, first drying step, etching step, second coating step, and second drying step may be repeatedly performed.

After each of the first drying step and second drying step, a cooling step of cooling the substrate may be provided. This can rapidly lower the temperature of the substrate which has been at a high temperature in the first drying step and second drying step to an optimum temperature for the etching step being a subsequent step.

In the substrate treatment method, when the first coating step, first drying step, etching step, second coating step, and second drying step are repeatedly performed, a plurality of the substrates for which treatments for the first time have been finished may be temporarily housed in a buffer unit in sequence, and after the first coating step for the last substrate in a lot is finished, treatments for the second time for the substrates sequentially carried out of the buffer unit may be started.

In the first and second coating steps, the coating solution may be supplied to the front surface of the substrate with the substrate being horizontally rotated, and in the etching step, the etching solution may be supplied to the front surface of the substrate with the substrate being horizontally rotated. This makes it possible to uniformly form the coating film on the entire front surface of the substrate in the first coating step, to etch the coating film uniformly in the horizontal direction and in the depth direction in the etching step, and to uniformly form the coating film on the front surface of the etched coating film in the second coating step.

In the first drying step and second drying step, the substrate may be horizontally rotated, and a drying gas may be supplied to the substrate. This allows a centrifugal force caused by the rotation of the substrate to remove the etching solution served for the treatment and the supply of the drying gas to dry the substrate.

In the present invention, the temperature of the etching solution is preferably adjusted, for example, to 20° C. to 50° C. Further, as the etching solution, one of a solvent for the coating solution, a hydrofluoric acid solution, an acid solution and an alkaline solution can be used.

According to another aspect, a substrate treatment apparatus of the present invention includes: a holding means for holding the substrate to be horizontally rotatable; a coating solution supply nozzle for supplying the coating solution to the substrate held by the holding means; an etching solution supply nozzle for supplying an etching solution for etching the coating film formed on the substrate held by the holding means; a heating means for heating the substrate; a temperature adjusting means for adjusting the temperature of the heating means; and a control means for conducting rotation control of the holding means, supply control of the coating solution supply nozzle and etching solution supply nozzle, and temperature control of the temperature adjusting means. The control means executes a step of supplying the coating solution to the substrate rotated by the holding means to form a coating film on the front surface of the substrate, thereafter a step of heating the substrate having the coating film formed thereon to adjust an etching condition of the coating film, a step of supplying the etching solution to the substrate to etch the coating film, thereafter a step of supplying the coating solution to the substrate to form a flat coating film on the front surface of the substrate, and then a step of heating the substrate to cure the coating film. In this case, the heating means may be embedded in the holding means. The substrate treatment apparatus may further include a cooling means for cooling the substrate.

According to still another aspect, the substrate treatment apparatus of the present invention is a substrate treatment apparatus for supplying a coating solution to a substrate with projections and depressions on a front surface thereof to form a coating film on the front surface of the substrate, including: a coating unit for forming the coating film on the front surface of the substrate; an etching unit for etching the coating film formed on the substrate; a heating unit having a heating means for heating the substrate; a temperature adjusting means for adjusting the temperature of the heating means; a cooling unit having a cooling means for cooling the substrate; a carrier unit for carrying-in/out the substrate between the coating unit, etching unit, heating unit, and cooling unit; and a control means for controlling the units and the temperature adjusting means. The coating unit includes a holding means for holding the substrate to be horizontally rotatable and a coating solution supply nozzle for supplying the coating solution to the substrate held by the holding means, and the etching unit includes a holding means for holding the substrate to be horizontally rotatable and an etching solution supply nozzle for supplying an etching solution for etching the coating film formed on the substrate. The control means executes a step of supplying the coating solution to the substrate rotated by the holding means of the coating unit to form a coating film on the front surface of the substrate, a step of heating the substrate having the coating film formed thereon to adjust an etching condition of the coating film, a step of supplying the etching solution to the substrate to etch the coating film, a step of supplying the coating solution to the substrate to form a flat coating film on the front surface of the substrate, and then a step of heating the substrate to cure the coating film.

In this case, the etching unit may further have a cleaning solution supply nozzle for supplying a cleaning solution for suppressing etching to the substrate. Further, the coating unit has an etching solution supply nozzle for supplying an etching solution for etching the coating film formed on the substrate.

The substrate treatment apparatus may further include a buffer unit to/from which the carrier unit is capable of delivering and receiving the substrate, and which is capable of housing a plurality of the substrates. Further, in the substrate treatment apparatus, the etching unit may have a drying gas supply nozzle for supplying a drying gas to the substrate.

Further, in the substrate treatment apparatus, the etching unit may be composed of a plurality of units capable of supplying different kinds of etching solutions different from each other so that the etching unit selected according to a condition of the film thickness or the like of the coating film is usable. This makes it possible to etch the coating film using a most suitable etching solution for the condition of the film thickness or the like of the coating film.

Further, in the substrate treatment apparatus, the etching unit may have a temperature adjusting means for adjusting the temperature of the etching solution to a predetermined temperature, the temperature adjusting means being provided along a supply pipe connecting an etching solution supply source and the etching solution supply nozzle.

Further, the etching unit may include a concentration adjusting means for adjusting the concentration of the etching solution to a predetermined concentration. As the etching solution, for example, one of a solvent for the coating solution, a hydrofluoric acid solution, an acid solution and an alkaline solution can be used.

As described above, according to the present invention, the coating film can be formed with its initial level difference due to projections and repressions being made small within an allowable range, so that the coating film can be flattened with uniformity and high accuracy.

DETAILED DESCRIPTION OF THE PREFERRED EMBODIMENTS

Hereinafter, preferred embodiments of the present invention will be described in detail with reference to the accompanying drawings. A case will be described now in which the substrate treatment method according to the present invention is applied to the SOG film forming method for a semiconductor wafer.

Figure 1:
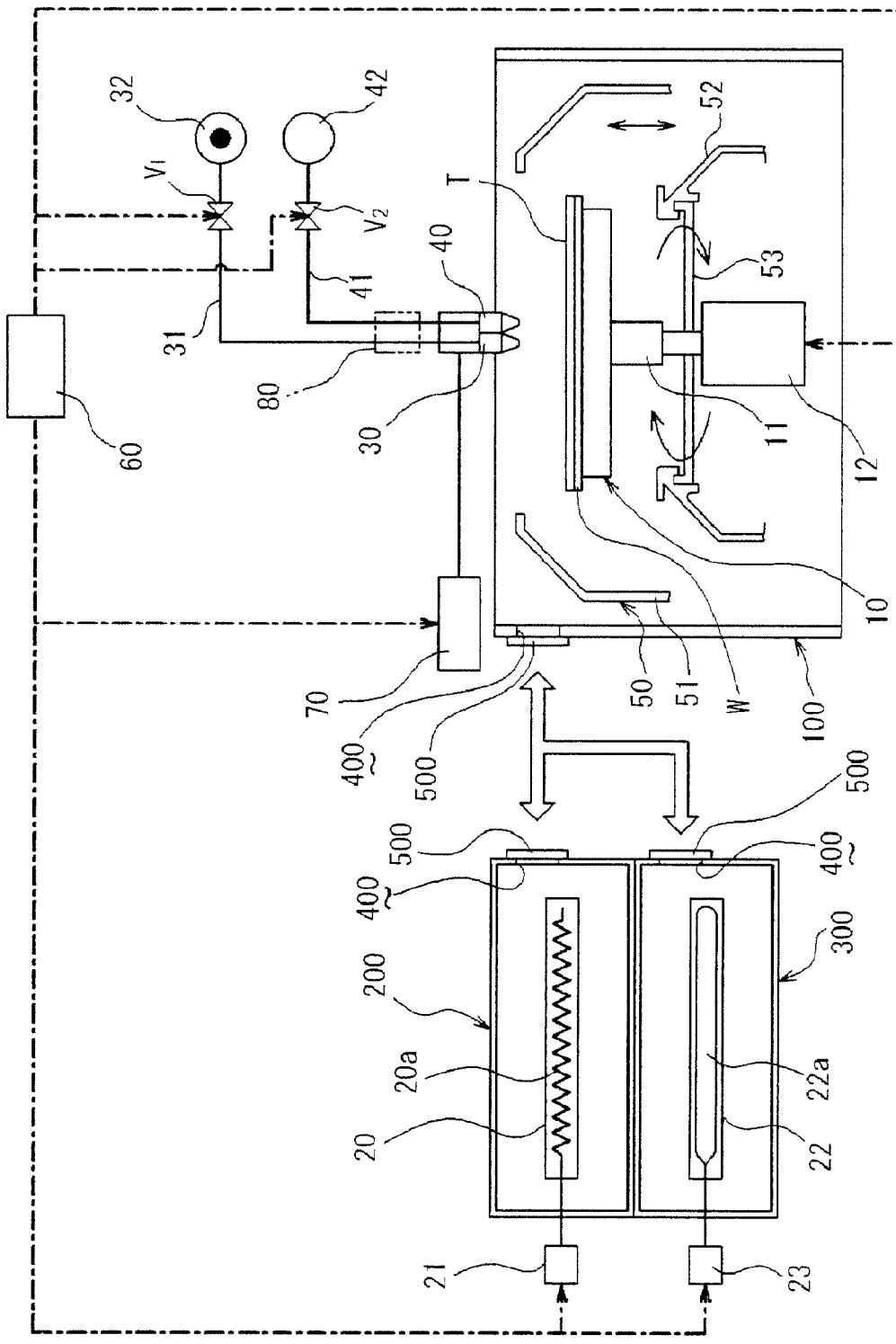
FIG. 1 is a schematic side view showing a first embodiment of a substrate treatment apparatus according to the present invention.
Figure 2A:
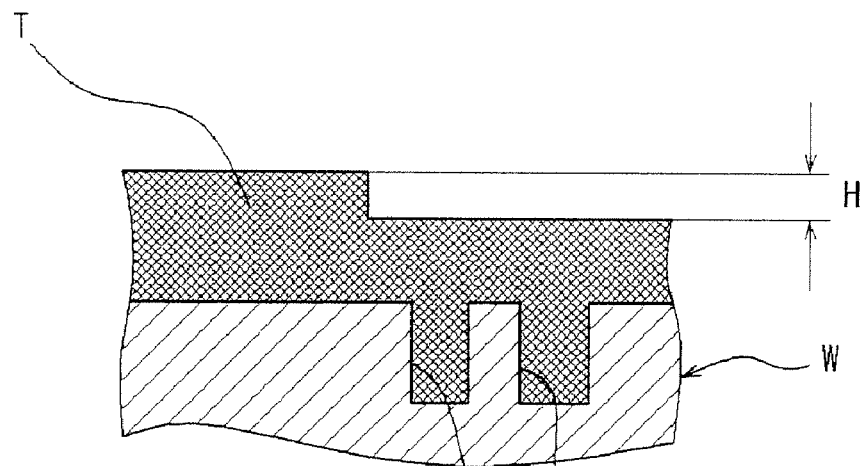
FIG. 2A to FIG. 2C are enlarged cross-sectional views of a main part each showing a film formation state of a coating film in the first embodiment of a substrate treatment method according to the present invention.
Figure 2B:
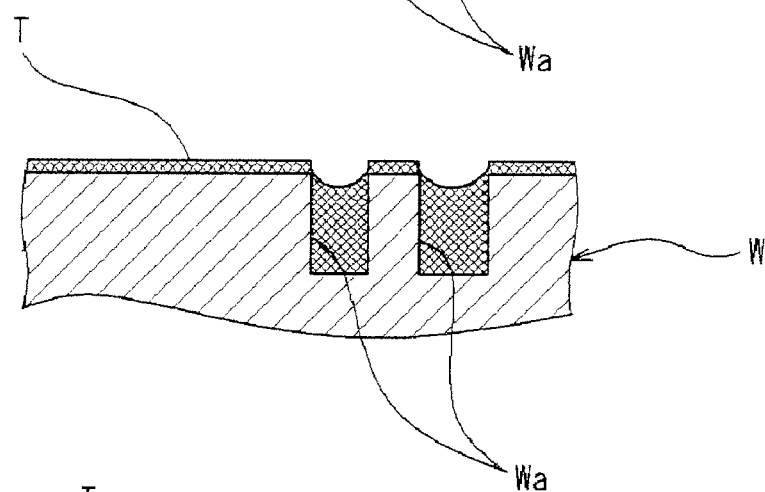
Figure 2C:
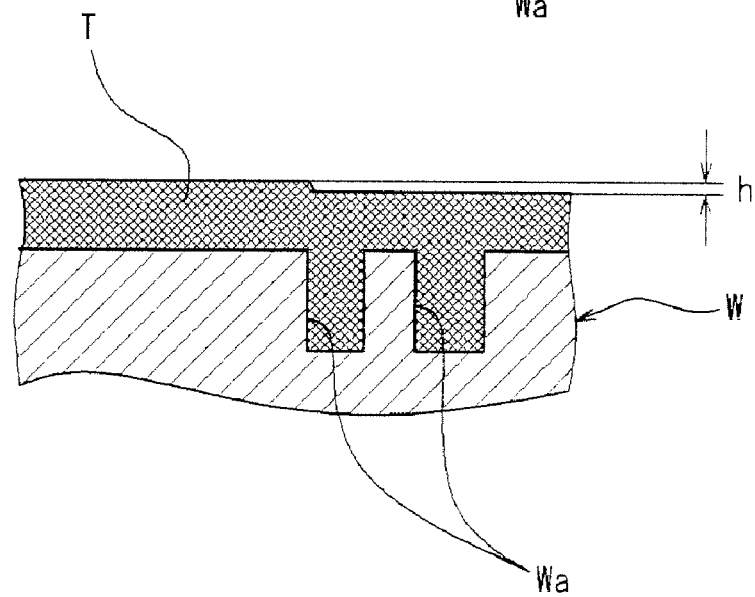

FIG. 1 is a schematic cross-sectional view showing a first embodiment of a substrate treatment apparatus according to the present invention. The substrate treatment apparatus includes a spin chuck 10 that is a rotating and holding means for holding and horizontally rotating a semiconductor wafer W (hereinafter, referred to as a wafer W) that is a substrate having an uneven surface, a heating means 20 for heating the wafer W to a predetermined temperature, a cooling means 22 for cooling the wafer W heated by the heating means 20, a coating solution supply nozzle 30 for dropping (supplying) an SOG solution, such as polysilazane that is a coating solution onto the front surface of the wafer W, and a solvent supply nozzle 40 for dropping (supplying) a solvent for the coating solution (SOG) as an etching solution, such as dibutyl ether onto the front surface of the wafer W.

The spin chuck 10 is housed in a cup 50 composed of an outer cup 51 capable of rising and lowering and an inner cup 52, and coupled to a motor 12 via a rotation axis 11 passing through a bottom portion 53 of the inner cup 52 in a manner to be able to rise and lower. The motor 12 rotates at a predetermined number of rotations based on a control signal from a controller 60 constituted by a control means, for example, a central processing unit (CPU). The spin chuck 10 is also configured to be able to rise and lower by means of a not-shown raising and lowering means. The spin chuck 10 is configured to receive the wafer W from a carrier arm (not shown) being a carrier unit moved to a position above the spin chuck 10, which is movable in a horizontal X-Y direction and a vertical Z-direction and horizontally rotatable, hold the wafer W thereon by suction, and pass the wafer W to the carrier arm raised and moved to the position above the spin chuck 10 after a later-described treatment for a coating film is finished. Note that the carrier arm is controlled by the controller 60.

The heating means 20 is composed of a hot plate incorporating a heater 20a disposed in a heating unit 200 located outside a coating unit 100 in which the spin chuck 10 and the cup 50 are disposed, and connected to a temperature adjuster 21 that is a temperature adjusting means. The heating means 20 is configured to be set a predetermined temperature, that is, a temperature to adjust etching conditions, for example, 150° C. and a temperature to cure (bake) the coating film, for example, 160° C. by the temperature adjuster 21 being controlled based on the control signal from the controller 60.

Figure 5:
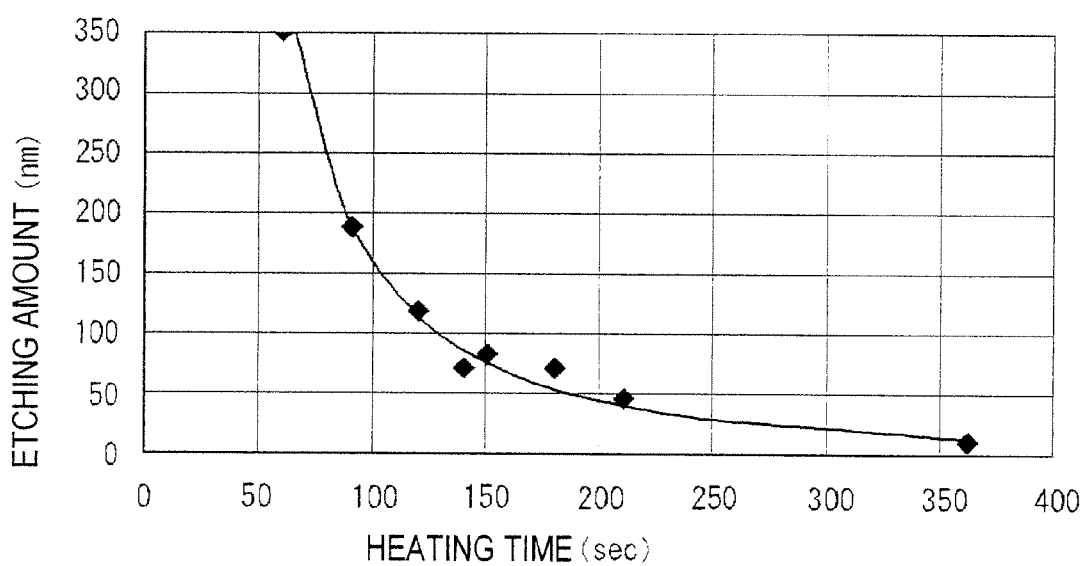
FIG. 5 is a graph showing the relation between the etching amount of a solvent and the heating time in the present invention.

In this case, the etching conditions can be appropriately selected from the relation between the etching amount and heating time (etching time). For example, when the solvent (dibutyl ether) for the coating solution (SOG) was discharged (dropped, supplied) to a central position of the wafer W for 10 seconds at 1 cc/sec, and the relation between the etching amount (nm) and the heating time (sec) under a condition of a heating temperature of 150° C. was evaluated, the result shown in FIG. 5 was obtained. As can be seen from the evaluation result, if the heating time is long, etching no longer proceeds, whereas if the heating time is short, complete peeling occurs. The heating time is selected based on the evaluation result. For example, when a heating time of 120 (sec) is selected, the etching amount is 120 (nm), whereas when a heating time of 210 (sec) is selected, the etching amount is about 50 (nm).

The control of the etching amount can be conducted by the heating conditions such as the heating temperature, the heating time and so on, by the solvent conditions of the discharge amount (the drop amount, the supply amount), the discharge time and so on of the solvent, or by a combination of both the heating conditions and the solvent conditions.

The cooling means 22 is composed of a cooling plate incorporating a coolant pipe 22a disposed in a cooling unit 300 located under the heating unit 200, and connected to a cooling temperature adjuster 23 that is a cooling temperature adjusting means. The cooling means 22 is set to lower the temperature of the wafer W heated by the heating means 20 to a predetermined temperature, for example, 23° C. by the cooling temperature adjuster 23 being controlled based on the control signal from the controller 60. Note that the cooling means 22 may be provided beside the heating means 20.

A carry-in/out port 400 for the wafer W is provided at the side of each of the coating unit 100, the heating unit 200 and the cooling unit 300, and can be opened/closed by a shutter 500 which is raised and lowered by a not-shown raising and lowering mechanism. Further, a not-shown carrier arm controlled by the controller 60 can deliver the wafer W between the coating unit 100, the heating unit 200 and the cooling unit 300.

On the other hand, the coating solution supply nozzle 30 is connected to a coating solution supply source 32 via a coating solution supply pipe 31 provided with an open/close valve V1. Besides, the solvent supply nozzle 40 is disposed adjacent to the coating solution supply nozzle 30 and connected to a solvent supply source 42 via a solvent solution supply pipe 41 provided with an open/close valve V2. Note that a temperature adjuster 80 that is a temperature adjusting means for adjusting the temperature of the coating solution and the solvent to a predetermined temperature, for example, 20° C. to 50° C. is provided along the coating solution supply pipe 31 and the solvent supply pipe 41. The coating solution supply nozzle 30 and the solvent supply nozzle 40 are formed to be able to move, by means of a nozzle moving mechanism 70, to a position above a central position of the spin chuck 10 and to a waiting position outside the cup 50. In this case, the nozzle moving mechanism 70 moves the coating solution supply nozzle 30 and the solvent supply nozzle 40 to the position above the central position of the spin chuck 10 and to the waiting position outside the cup 50 based on the control signal from the controller 60.

Figure 3A:
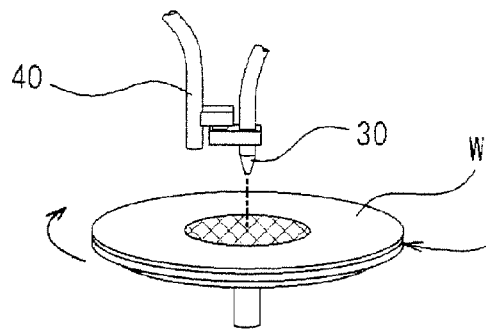
FIG. 3A to FIG. 3F are schematic perspective views each showing each step in the present invention.
Figure 3B:
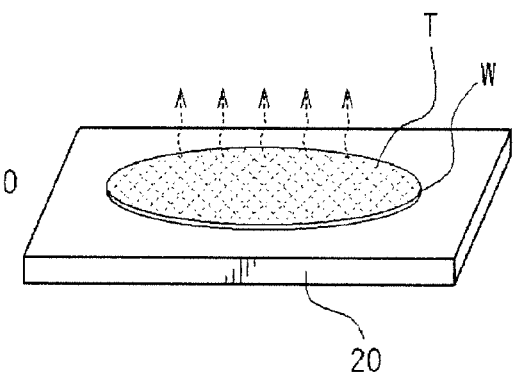
Figure 3C:
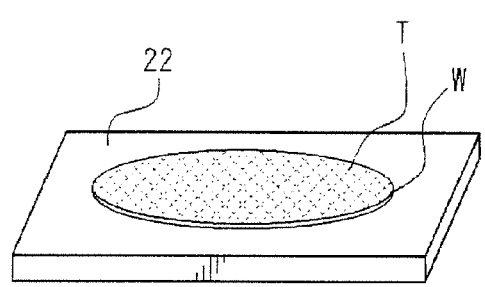
Figure 3D:
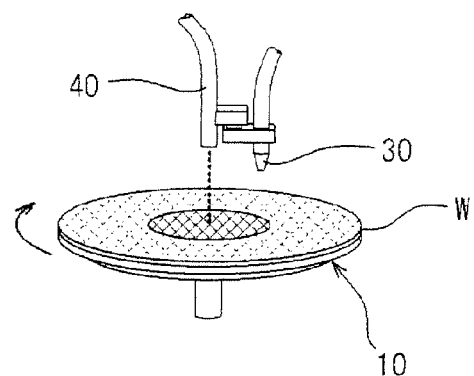
Figure 3E:
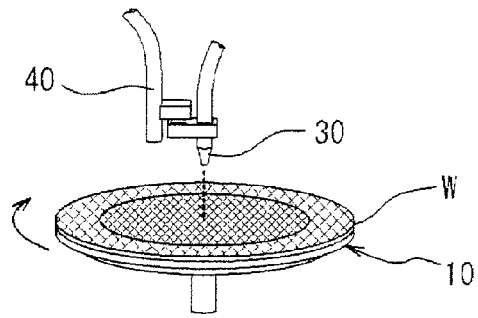
Figure 3F:
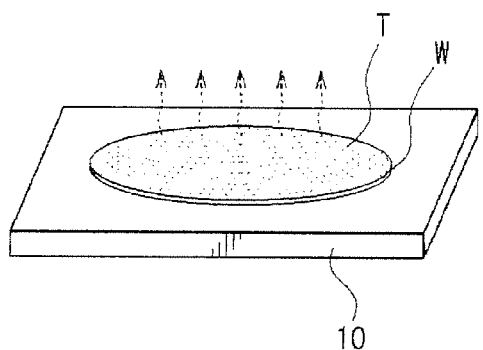
Figure 4:
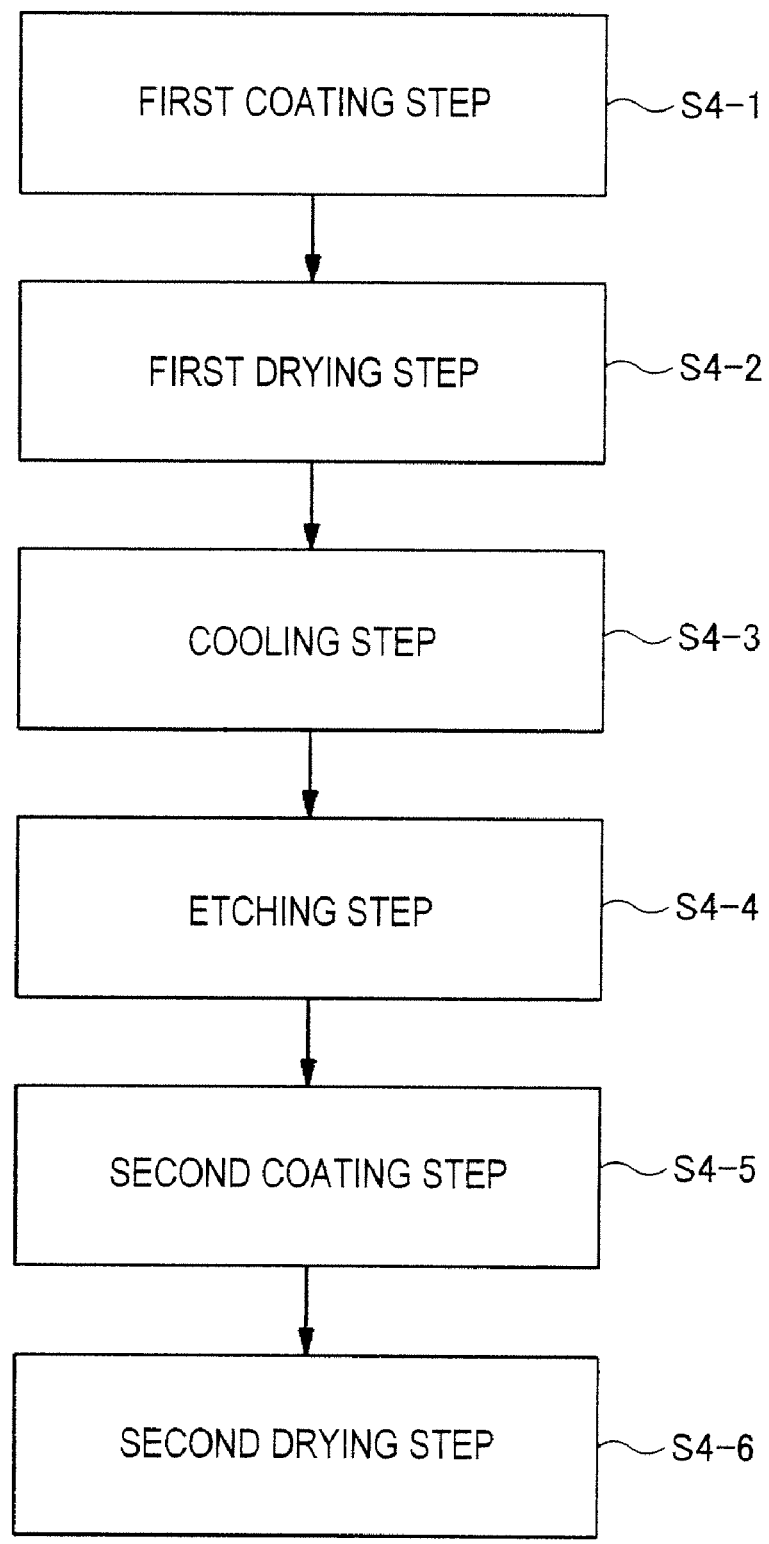
FIG. 4 is a flowchart showing a procedure of film formation of a coating film in the first embodiment of the substrate treatment method according to the present invention.

Next, the operational aspect of the substrate treatment apparatus according to the present invention configured as described above will be described with reference to FIG. 1, FIGS. 2A to 2C, FIGS. 3A to 3F, and the flowchart shown in FIG. 4.

First of all, an unprocessed wafer W is carried into the coating unit 100 and delivered to the spin chuck 10 by the not-shown carrier arm. The carrier arm then retracts, and the outer cup 51 rises. In this state, the open/close valve V1 provided along the coating solution supply pipe 31 is opened based on the control signal from the controller 60, and the motor 12 of the spin chuck 10 is driven. This allows the coating solution to be dropped (supplied) from the coating solution supply nozzle 30 onto the front surface of the wafer W rotating with the rotation of the spin chuck 10 as shown in FIG. 3A to form a coating film T of the coating solution with a level difference H on the front surface of the wafer W (see FIG. 2A) {first coating step: step S4-1}. After the formation of the coating film, the open/close valve V1 is closed based on the control signal from the controller 60 and the motor 12 is stopped.

Next, the carrier arm receives the wafer W on the spin chuck 10 and delivers the wafer W onto the hot plate 20 being the heating means in the heating unit 200. Based on the control signal from the controller 60, the temperature adjuster 21 operates to raise the temperature of the heater 20a of the heating means 20 to, for example, 150° C. to heat the wafer W for a heating time selected in advance from FIG. 5 to adjust the etching condition. This evaporates a part of liquid in the coating film T to slightly decrease the level difference in the coating film T as shown in FIG. 3B {first drying step: step S4-2}.

Next, the carrier arm receives the wafer W on the hot plate 20 and delivers the wafer W onto the cooling plate 22 being the cooling means in the cooling unit 300. Based on the control signal from the controller 60, the cooling temperature adjuster 23 operates to set the temperature of the coolant of the cooling means 22 to, for example, 23° C. to lower the temperature of the wafer W to 23° C. as shown in FIG. 3C {cooling step: step S4-3}.

Next, the carrier arm receives the wafer W on the cooling plate 22 and delivers the wafer W to the spin chuck 10 in the coating unit 100. Based on the control signal from the controller 60, the solvent supply nozzle 40 then moves to a position above the central portion of the wafer W, the open/close valve V2 provided along the solvent supply pipe 41 is opened, and the motor 12 of the spin chuck 10 is driven. This allows the solvent to be dropped (supplied) from the solvent supply nozzle 40 onto the front surface of the wafer W rotating with the rotation of the spin chuck 10 as shown in FIG. 3D to isotropically etch the coating film T (see FIG. 2B) {etching step: step S4-4}. After the isotropic etching with the solvent, the solvent (etching solution) is shaken out.

After the etching treatment, based on the control signal from the controller 60, the open/close valve V2 is closed, while the coating solution supply nozzle 30 moves again to the position above the central portion of the wafer W. In this state, the open/close valve V1 is opened based on the control signal from the controller 60, the coating solution is dropped (supplied) from the coating solution supply nozzle 30 onto the front surface of the wafer W rotating with the rotation of the spin chuck 10 as shown in FIG. 3E to form a substantially flat coating film T with a small level difference h within an allowable range on the front surface of the wafer W (see FIG. 2C) {second coating step: step S4-5}.

After the coating film is formed as described above, based on the control signal from the controller 60, the open/close valve V1 is closed, and the motor 12 is stopped. The carrier arm then receives the wafer W on the spin chuck 10 and delivers the wafer W onto the hot plate 20 (heating means) in the heating unit 200. Based on the control signal from the controller 60, the temperature adjuster 21 operates to raise the temperature of the heater 20a to, for example, 160° C. to heat the wafer W to thereby cure (bake) the coating film as shown in FIG. 3F {second drying step: step S4-6}.

After the curing (baking) treatment of the coating film T is performed as described above, the outer cup 51 is lowered and the spin chuck 10 is raised to pass the wafer W to the carrier arm which moves to the position above the spin chuck 10, so that the wafer W is carried out by the carrier arm from the substrate treatment apparatus.

Figure 6:
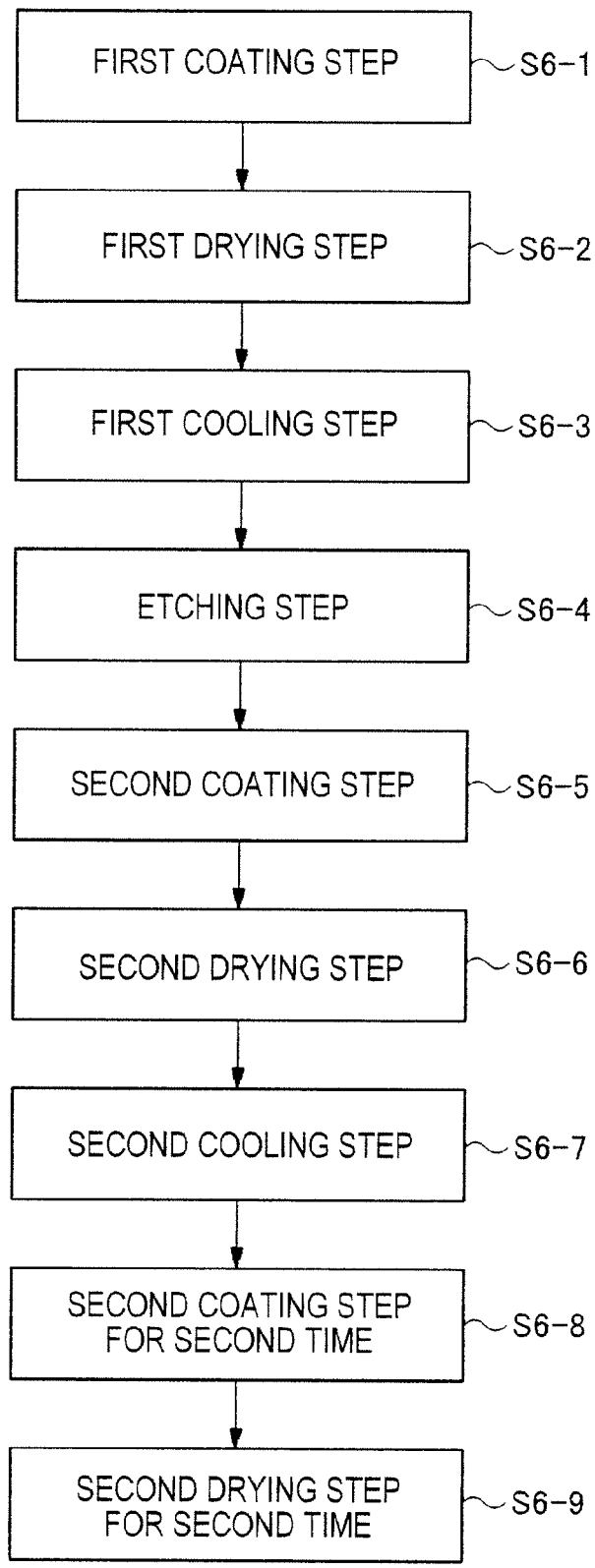
FIG. 6 is a flowchart showing a procedure of film formation of the coating film in a second embodiment of the substrate treatment method according to the present invention.
Figure 7A:
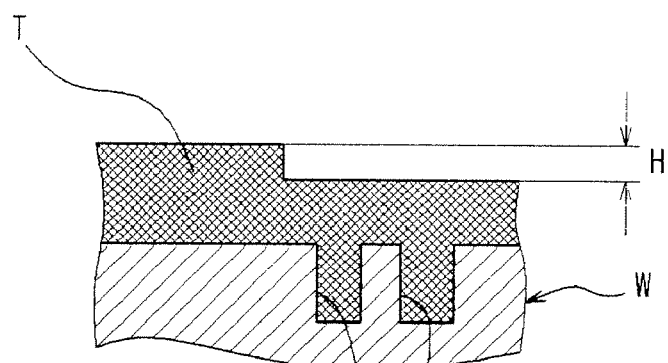
FIG. 7A to FIG. 7D are enlarged cross-sectional views of a main part each showing a film formation state of the coating film in the second embodiment of the substrate treatment method according to the present invention.
Figure 7B:
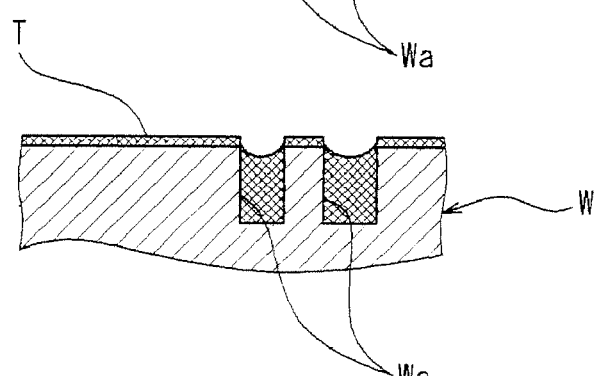
Figure 7C:
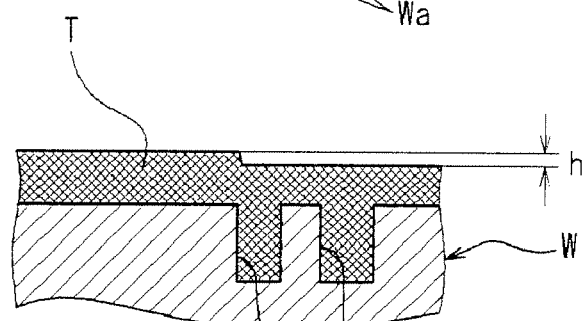
Figure 7D:
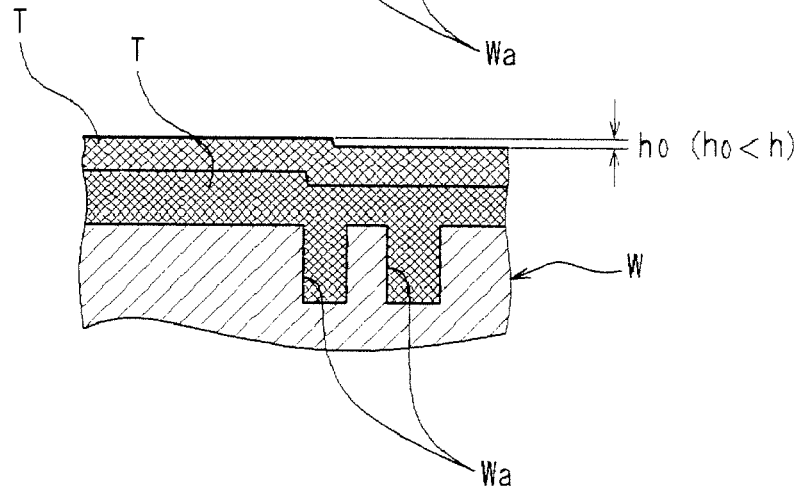

While a case in which a flat coating film is formed on the front surface of the wafer W with projections and depressions through the first coating step, the first drying step, the cooling step, the etching step, the second coating step, and the second drying step has been described in the above embodiment, the second coating step and the second drying step may be repeatedly performed in order to further decrease the level difference in the coating film T. More specifically, as shown in FIG. 6, the first coating step (step S6-1), the first drying step (step S6-2), the first cooling step (step S6-3), the etching step (step S6-4), the second coating step (step S6-5), the second drying step (step S6-6), and the second cooling step (step S6-7) are performed as in the first embodiment to form a coating film T with a level difference h smaller than the level difference H in the initial coating film T, as shown in FIG. 7C, and thereafter the second coating step for the second time (step S6-8) and the second drying step for the second time (step S6-9) may be performed. This ensures that the coating films T are stacked and a coating film T with a level difference h0 smaller than the level difference h is formed.

Figure 8:
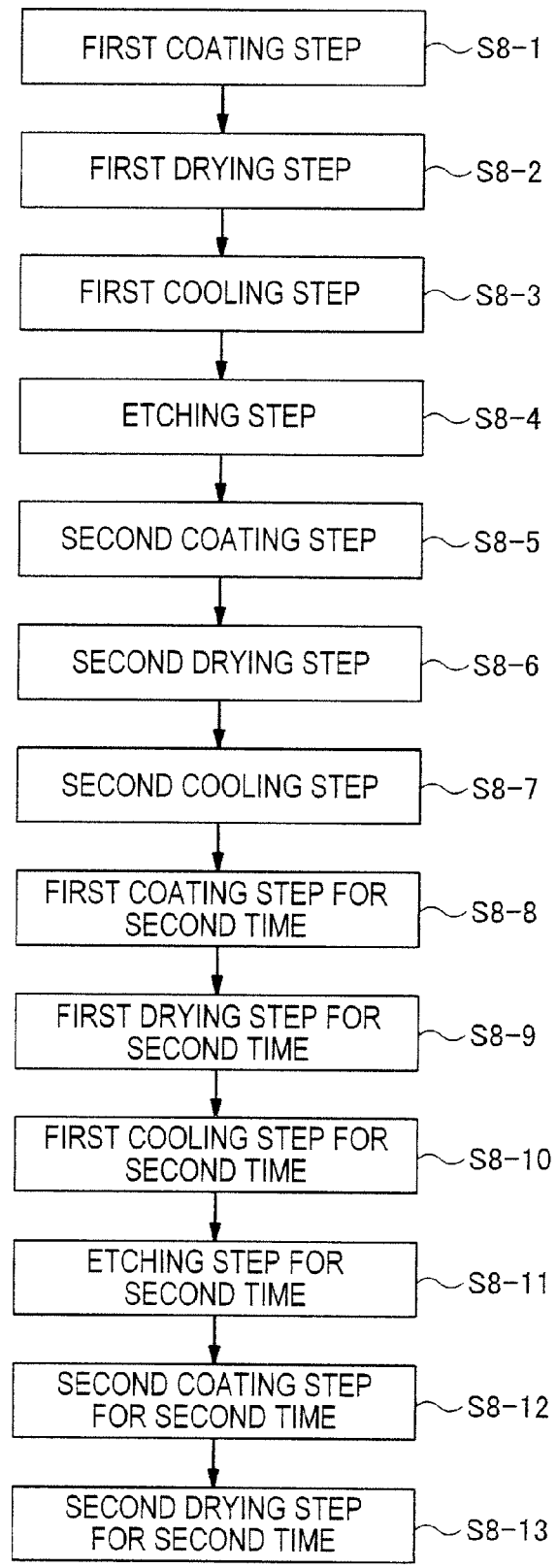
FIG. 8 is a flowchart showing a procedure of film formation of the coating film in a third embodiment of the substrate treatment method according to the present invention.
Figure 9A:
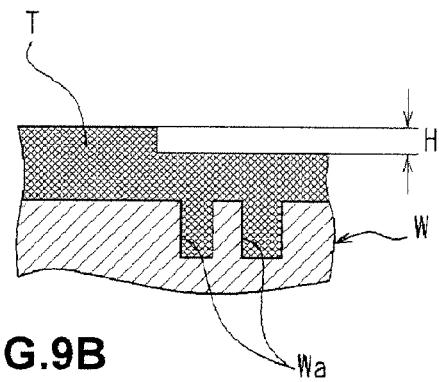
FIG. 9A to FIG. 9F are enlarged cross-sectional views of a main part each showing a film formation state of the coating film in the third embodiment of the substrate treatment method according to the present invention.
Figure 9B:
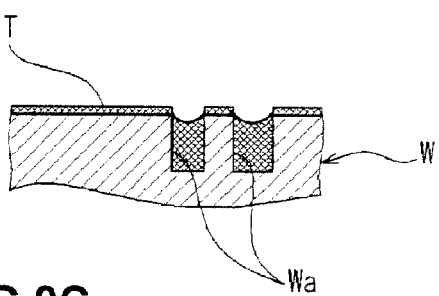
Figure 9C:
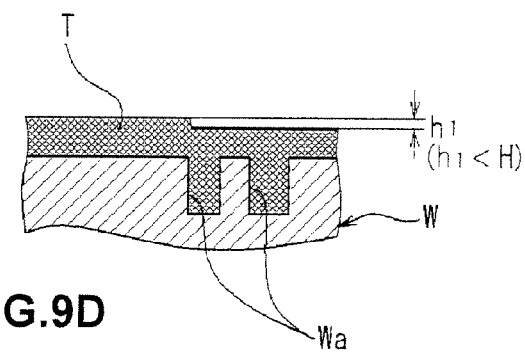
Figure 9D:
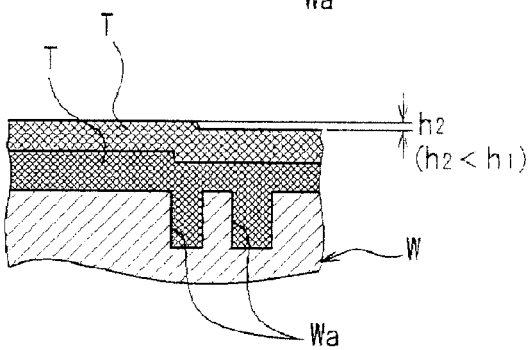
Figure 9E:
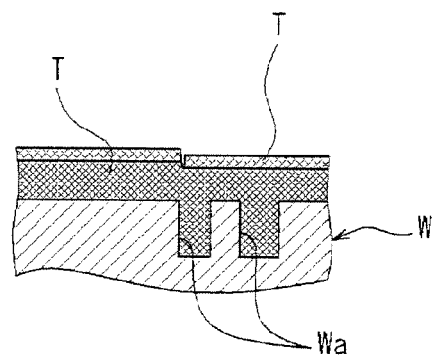
Figure 9F:
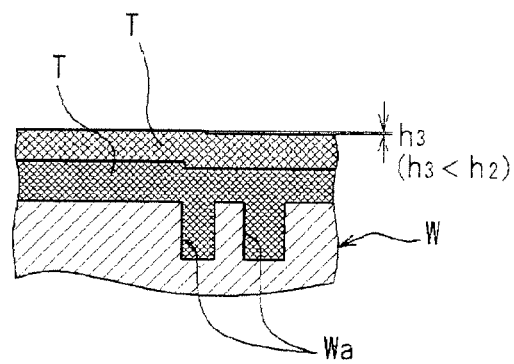

In place of the second embodiment, the first coating step, the first drying step, the first cooling step, the etching step, the second coating step, the second drying step, and the second cooling step may be repeatedly performed a plurality of times. For example, as shown in FIG. 8, the first coating step (step S8-1, see FIG. 9A), the first drying step (step S8-2), the first cooling step (step S8-3), the etching step (step S8-4, see FIG. 9B), the second coating step (step S8-5), the second drying step (step S8-6), and the second cooling step (step S8-7) are performed as in the first embodiment to form a coating film T with a level difference h1 smaller than the level difference H in the initial coating film T, as shown in FIG. 9C, and thereafter the first coating step for the second time (step S8-8) may be performed to form a coating film T with a level difference h2 smaller than the level difference h1 (see FIG. 9D), and then the first drying step for the second time (step S8-9), the first cooling step for the second time (step S8-10), the etching step for the second time (step S8-11, see FIG. 9E), the second coating step for the second time (step S8-12), and the second drying step for the second time (step S8-13) may be performed. This ensures that the coating films T are stacked and a coating film T with a level difference h3 further smaller than the level difference h2 is formed (see FIG. 9F).

Figure 10:
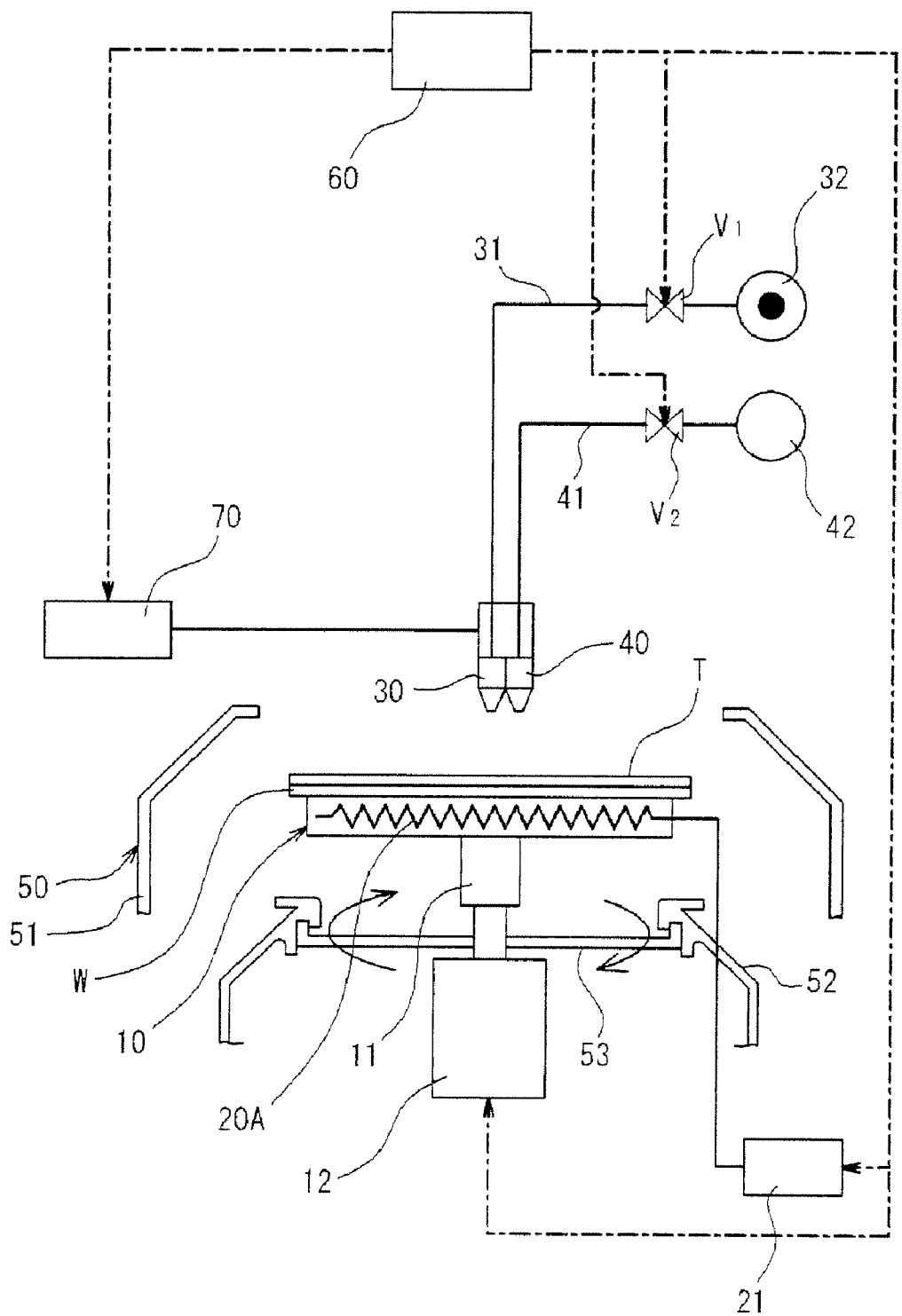
FIG. 10 is a schematic cross-sectional view showing a second embodiment of the substrate treatment apparatus according to the present invention.

Note that while a case in which the heating means 20 is disposed in the heating unit 200 outside the coating unit 100 has been described in the above-described embodiments, the heating means may be composed of a heater 20*a* embedded in the spin chuck 10 as shown in FIG. 10. Note that in FIG. 10, other portions are the same as those shown in FIG. 1, and therefore the same numbers are given to those same portions to omit their description.

According to the substrate treatment apparatus configured as described above, a coating film can be formed on the wafer W as follows.

Namely, as shown in FIG. 11, an unprocessed wafer W is carried into the cup 50 and delivered to the spin chuck 10 by a not-shown carrier arm. The carrier arm then retracts, and the outer cup 50 rises. In this state, the open/close valve V1 provided along the coating solution supply pipe 31 is opened based on the control signal from the controller 60, and the motor 12 of the spin chuck 10 is driven. This allows the coating solution to be dropped (supplied) from the coating solution supply nozzle 30 onto the front surface of the wafer W rotating with the rotation of the spin chuck 10 as shown in FIG. 11A to form a coating film T of the coating solution with a level difference H on the front surface of the wafer W (see FIG. 2A) {first coating step}.

Figure 11A:
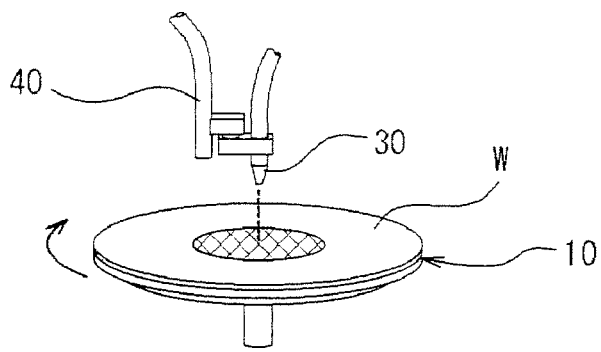
FIG. 11A to FIG. 11E are schematic perspective views each showing each step when the substrate treatment apparatus shown in FIG. 10 is used.
Figure 11B:
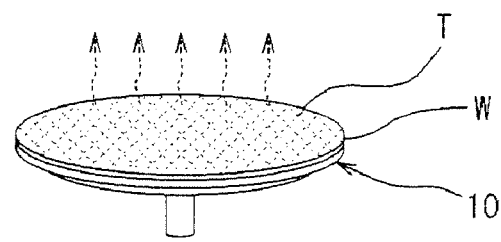

After the formation of the coating film, the open/close valve V1 is closed based on the control signal from the controller 60 and the motor 12 is stopped. Next, based on the control signal from the controller 60, the temperature adjuster 21 operates to raise the temperature of the heater 20*a* being a heating means to, for example, 150° C. to heat the wafer W for a heating time selected in advance from FIG. 5 to adjust the etching condition. This evaporates a part of liquid in the coating film T to slightly decrease the level difference in the coating film T as shown in FIG. 11B {first drying step}. After the first drying step, the wafer W is cooled to, for example, 23° C. {first cooling step}.

Figure 11C:
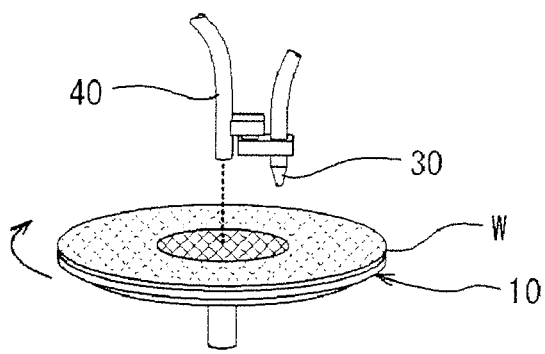

Based on the control signal from the controller 60, the solvent supply nozzle 40 then moves to a position above the central portion of the wafer W, the open/close valve V2 provided along the solvent supply pipe 41 is opened, and the motor 12 of the spin chuck 10 is driven. This allows the solvent to be dropped (supplied) from the solvent supply nozzle 40 onto the front surface of the wafer W rotating with the rotation of the spin chuck 10 as shown in FIG. 11C to isotropically etch the coating film T (see FIG. 2B) {etching step }.

Figure 11D:
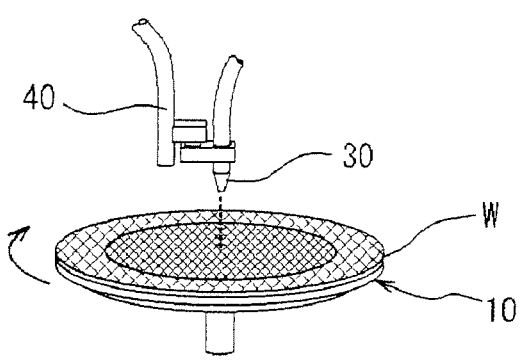

After the etching treatment, based on the control signal from the controller 60, the open/close valve V2 is closed, while the coating solution supply nozzle 30 moves again to the position above the central portion of the wafer W. In this state, the open/close valve V1 is opened based on the control signal from the controller 60, the coating solution is dropped (supplied) from the coating solution supply nozzle 30 onto the front surface of the wafer W rotating with the rotation of the spin chuck 10 as shown in FIG. 11D to form a substantially flat coating film T with a small level difference h within an allowable range on the front surface of the wafer W (see FIG. 2C) {second coating step}.

Figure 11E:
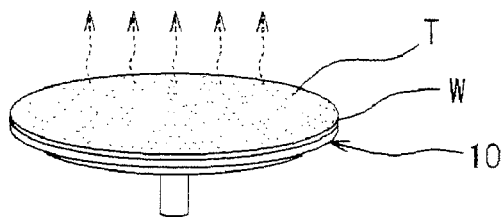

After the coating film is formed as described above, based on the control signal from the controller 60, the open/close valve V1 is closed, and the motor 12 is stopped. Based on the control signal from the controller 60, the temperature adjuster 21 then operates to raise the temperature of the heater 20*a* to, for example, 160° C. to heat the wafer W to thereby cure (bake) the coating film as shown in FIG. 11E {second drying step}.

After the curing (baking) treatment of the coating film T is performed as described above, the outer cup 51 is lowered and the spin chuck 10 is raised to pass the wafer W to the carrier arm which moves to the position above the spin chuck 10, so that the wafer W is carried out by the carrier arm from the substrate treatment apparatus.

While a case in which a flat coating film is formed on the front surface of the wafer W with projections and depressions through the first coating step, the first drying step, the first cooling step, the etching step, the second coating step, and the second drying step has been described in the above embodiment, the second coating step and the second drying step may be repeatedly performed in order to further decrease the level difference in the coating film T as in the above description. Alternatively, the first coating step, the first drying step, the first cooling step, the etching step, the second coating step, the second drying step, and the second cooling step may be repeatedly performed a plurality of times.

While a case in which the etching solution for etching the coating film is a solvent for SOG, such as dibutyl ether has been described, etching solutions other than the solvent for SOG, for example, a hydrofluoric acid solution such as HF, BHF or the like, an acid solution such as hydrochloric acid, sulfuric acid or the like, or an alkaline solution such as NaOH, KOH or the like can be used depending on the conditions of the film thickness and so on of SOG in the present invention.

Next, an example of a substrate processing system employing a substrate treatment apparatus capable of treatment using different etching solutions will be described.

Figure 12A:
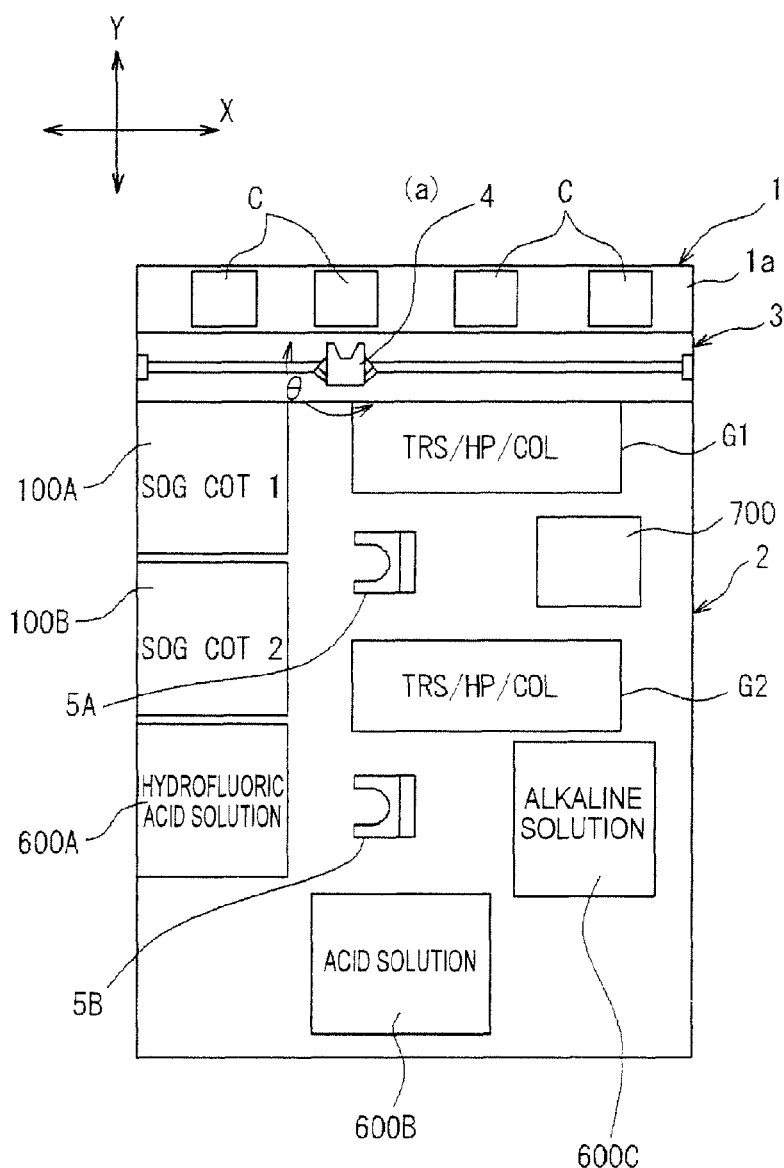
FIG. 12A is a schematic plan view showing an example of a substrate processing system including the substrate treatment apparatus according to the present invention.

The primary part of the substrate processing system is composed of, as shown in FIG. 12A, a cassette station 1 which functions as a carry-in portion and a carry-out portion for carrying-in/out a plurality of, for example, 25 wafers W per wafer cassette C as a unit from/to the outside to/from the system and carrying-in/out the wafers W from/to the wafer cassette C; a processing station 2 for performing formation of a coating film T, etching treatment and the like on the wafer W; and an interface station 3 provided between the cassette station 1 and the processing station 2 for transferring the wafer W.

The interface station 3 is configured such that, as shown in FIG. 12A, a plurality of, for example, up to four wafer cassettes C are mounted on a cassette mounting table 1*a* in a line along a horizontal X-direction with the respective wafer ports facing toward the processing station 2, and a pair of tweezers 4 for wafer carriage, which is movable in a cassette-arrangement direction (an X-direction) and in a wafer-arrangement direction of the wafers W housed in the wafer cassette C (a Z-direction), performs selective carriage for each of the wafer cassettes. The pair of tweezers 4 for wafer carriage is configured to be rotatable in a θ-direction and can deliver the wafer W to a later-described transfer unit (TRS1, TRS2) included in a multi-tired unit section in a first unit group G1 on the processing station 2 side.

The processing station 2 comprises, as shown in FIG. 12A, two coating units 100A and 100B each for forming a coating film of SOG on the wafer W, three etching units composed of a hydrofluoric acid solution etching unit 600A, an acid solution etching unit 600B, and an alkaline solution etching unit 600C, the first unit group G1 disposed on the interface station 3 side in the processing station 2, a second unit group G2 disposed almost at central portion in the processing station 2, a first carrier arm 5A disposed between the coating units 100A and 100B, the first unit group G1, the second unit group G2, and a later-described buffer unit 700 to deliver the wafer W between the coating units 100A and 100B, the first unit group G1, the second unit group G2, and the buffer unit 700, and a second carrier unit 5B disposed between the second unit group G2, the hydrofluoric acid solution etching unit 600A, the acid solution etching unit 600B, and the alkaline solution etching unit 600C to deliver the wafer W between the second unit group G2, the hydrofluoric acid solution etching unit 600A, the acid solution etching unit 600B, and the alkaline solution etching unit 600C. Note that the buffer unit 700 is formed to be able to house a plurality of wafers W therein.

Figure 12B:
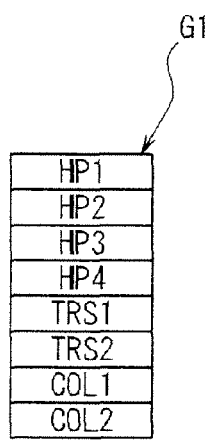
FIG. 12B is a schematic side view showing a first unit group in the substrate processing system.

In the first unit group G1, as shown in FIG. 12B, a first to a fourth heating unit (HP1 to HP4), the first and second transfer units (TRS1, TRS2), and a first and a second cooling unit (COL1, COL2) are stacked in order from the upper side to the lower side.

Figure 12C:
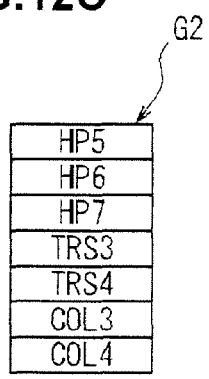
FIG. 12C is a schematic side view showing a second unit group.

In the second unit group G2, as shown in FIG. 12C, a fifth to a seventh heating unit (HP5 to HP7), a third and a fourth transfer unit (TRS3, TRS4), and a third and a fourth cooling unit (COL3, COL4) are stacked in order from the upper side to the lower side.

In the substrate processing system configured as described above, the first and second coating units 100A and 100B are configured similarly to the coating unit 100 in the first embodiment, and therefore their description will be omitted here. Further, the first to seventh heating units HP1 to HP7 and the first to fourth cooling units COL1 to COL 4 are also configured similarly to the heating unit 200 and the cooling unit 300 in the first embodiment, respectively.

On the other hand, the hydrofluoric acid solution etching unit 600A, the acid solution etching unit 600B, and the alkaline solution etching unit 600C are similarly configured except that those etching solutions are different from each other. Hereinafter, the hydrofluoric acid solution etching unit 600A will be described as a representative.

Figure 13:
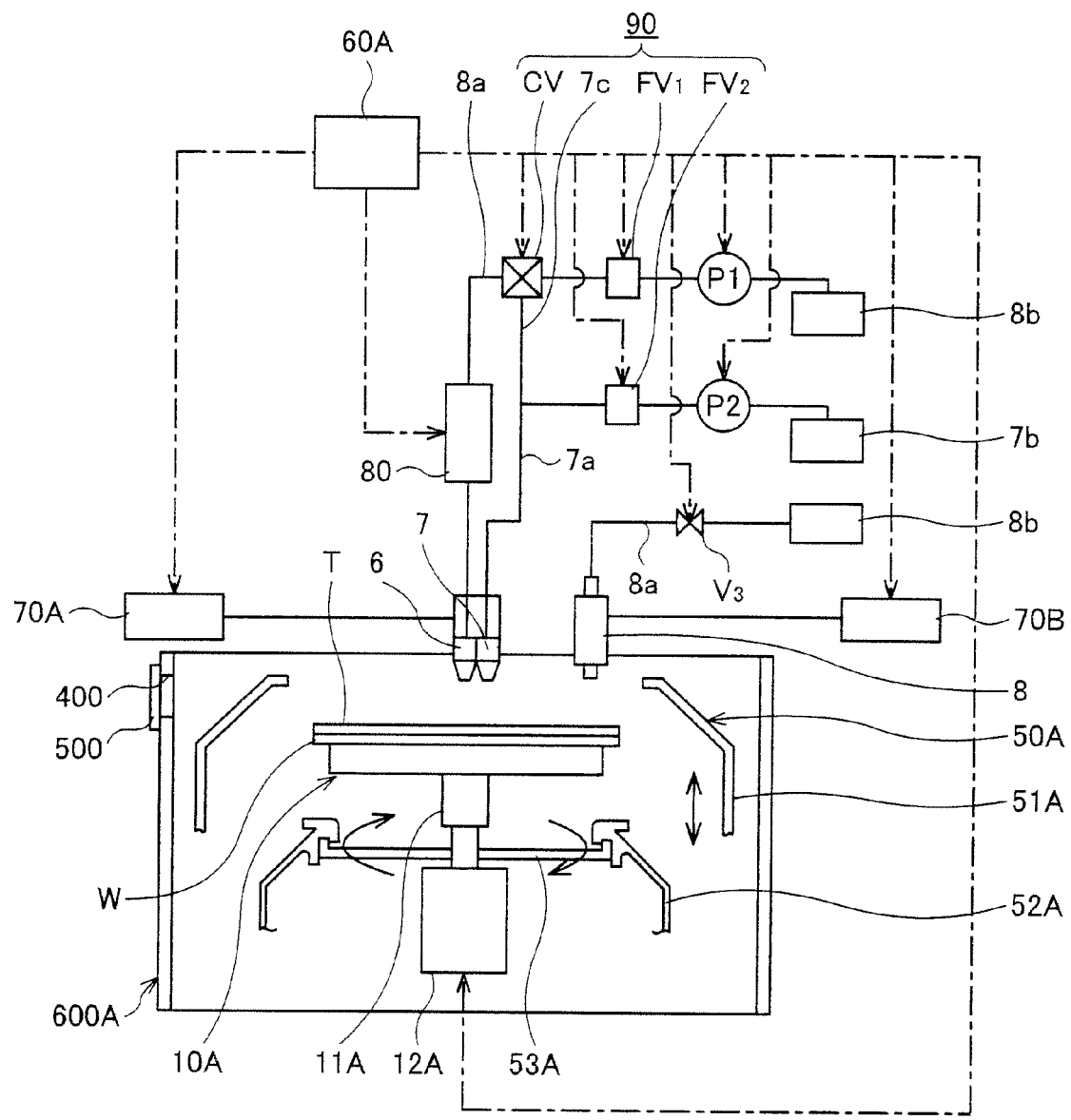
FIG. 13 is a schematic cross-sectional view showing an example of an etching unit in the present invention.
Figure 14:
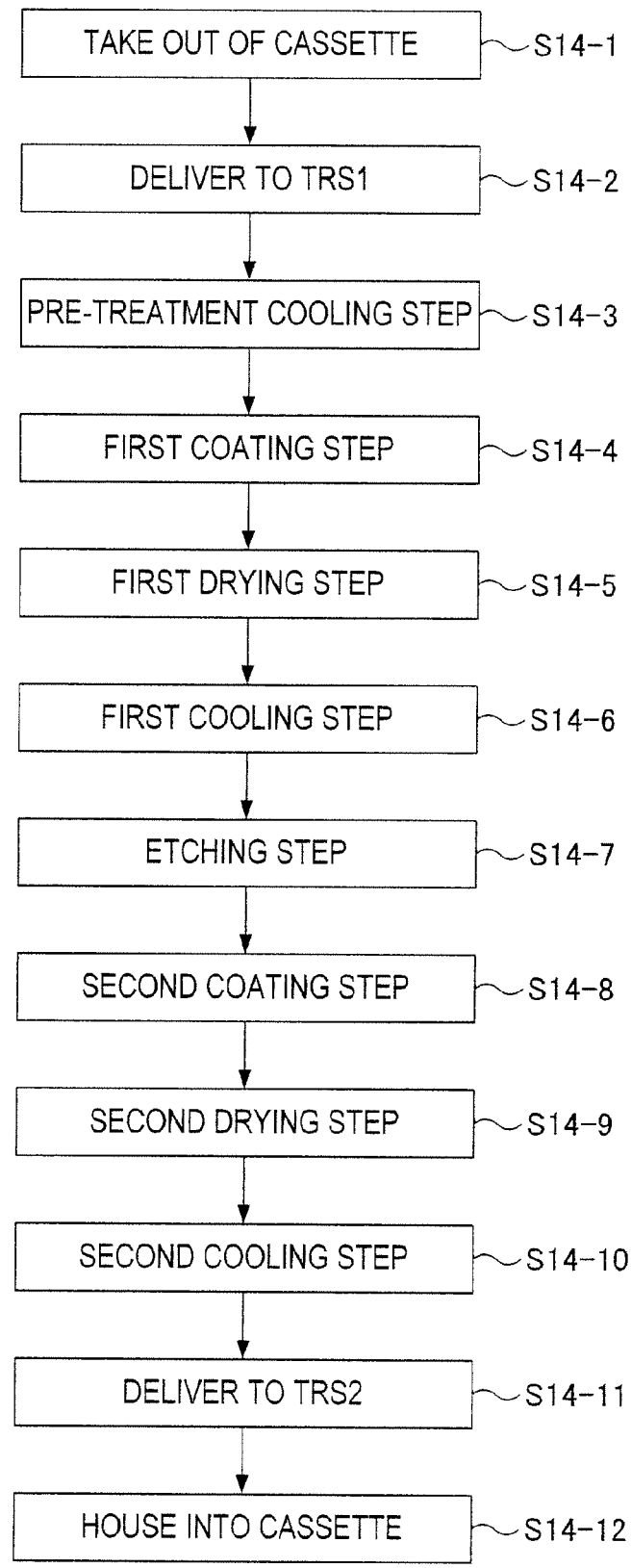
FIG. 14 is a flowchart showing a procedure of film formation of the coating film in a fourth embodiment of the substrate treatment method according to the present invention.
Figure 15:
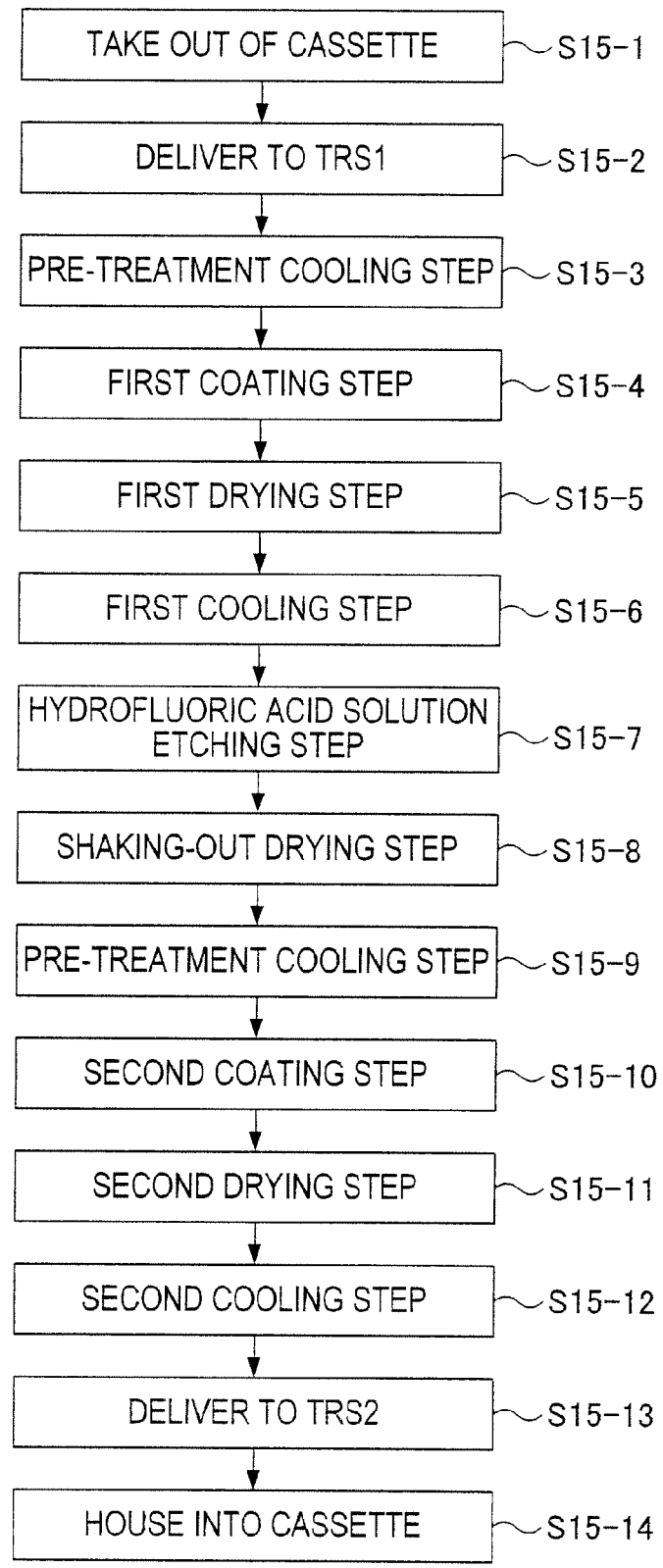
FIG. 15 is a flowchart showing a procedure of film formation of the coating film in a fifth embodiment of the substrate treatment method according to the present invention.

The hydrofluoric acid solution etching unit 600A comprises, as shown in FIG. 13, a spin chuck 10A that is a rotating and holding means for holding and horizontally rotating the wafer W, an etching solution supply nozzle 6 for dropping (supplying) a hydrofluoric acid solution that is the etching solution onto the front surface of the wafer W, a cleaning solution supply nozzle 7 for supplying a cleaning solution for suppressing (stopping) the etching, for example, pure water onto the wafer W, and a drying gas supply nozzle 8 for supplying (jetting) a drying gas, for example, a nitrogen (N$_2$) gas or clean air to the wafer W.

The spin chuck 10A is housed in a cup 50A composed of an outer cup 51A capable of rising and lowering and an inner cup 52A, and coupled to a motor 12A via a rotation axis 11A passing through a bottom portion 53A of the inner cup 52A in a manner to be able to rise and lower. The motor 12A rotates at a predetermined number of rotations based on a control signal from a controller 60A that is a control means. The spin chuck 10A is also configured to be able to rise and lower by means of a not-shown raising and lowering means. The spin chuck 10A is configured to receive the wafer W from the first carrier arm 5A being a carrier unit moved to a position above the spin chuck 10A, which is movable in a horizontal X-Y direction and a vertical Z-direction and horizontally rotatable, hold the wafer W thereon by suction, and pass the wafer W to the first carrier arm 5A raised and moved to the position above the spin chuck 10A after a later-described coating film treatment is finished. Note that the first carrier arm 5A and the second carrier arm 5B are controlled by the controller 60A.

The etching supply nozzle 6 is connected via an etching solution supply pipe 6a to a hydrofluoric acid solution tank 6b storing an etching solution (hydrofluoric acid solution) that is the etching solution supply source. The cleaning solution supply nozzle 7 is connected via a pure water supply pipe 7a to a pure water tank 7b storing pure water that is a cleaning solution supply source used also for a diluted hydrofluoric acid solution. In this case, the etching solution supply pipe 6a is provided with a pump P1, a flow rate control valve FV1, and a switching valve CV from the hydrofluoric acid solution tank 6b side. Further, the pure water supply pipe 7a is provided with a pump P2 and a flow rate control valve FV2 from the pure water tank 7b side, and a branch pipe 7c branching from the secondary side of the flow rate control valve FV2 is connected to the switching valve CV. The flow rate control valve FV1, the flow rate control valve FV2 and the switching valve CV constitute a concentration adjusting means 90 for the hydrofluoric acid solution. More specifically, the flow rate control valve FV1, the flow rate control valve FV2 and the switching valve CV are controlled by the controller 60A so that based on the control signal previously stored in the controller 60A, the hydrofluoric acid solution adjusted by the flow rate control valve FV1 and the pure water adjusted by the flow rate control valve FV2 can be mixed to obtain a hydrofluoric acid solution with a predetermined concentration.

The etching solution supply pipe 6a is provided with a temperature adjuster 80 that is a temperature control means for adjusting the temperature of the etching solution to a predetermined temperature, for example, 20° C. to 50° C. The temperature adjuster 80 is controlled by the control signal from the controller 60A to adjust the temperature of the etching solution to a predetermined temperature, for example, 20° C. to 50° C. depending on the conditions of the film thickness and so on of the coating film T.

The drying gas supply nozzle 8 is connected via a drying gas supply pipe 8a provided with an open/close valve V3 to a drying gas supply source, for example, a N2 gas supply source 8b.

The etching solution supply nozzle 6 and the cleaning solution supply nozzle 7 are configured to be able to move by means of a nozzle moving mechanism 70A to a position above a central position of the spin chuck 10A and to a waiting position outside the cup 50A. The drying gas supply nozzle 8 is also configured to be able to move by means of a nozzle moving mechanism 70B to a position above a central position of the spin chuck 10A and to a waiting position outside the cup 50A. Note that the drying gas supply nozzle 8 is preferably inclined to supply (jet) the N2 gas from the center of the wafer toward the peripheral side. Further, the drying gas supply nozzle 8 preferably supplies (jets) the N2 gas while scanning from a position above the center of the wafer W to a position above the periphery. In this case, the nozzle moving mechanisms 70A and 70B move the etching solution supply nozzle 6 and the cleaning solution supply nozzle 7, and the drying gas supply nozzle 8 to the position above the central position of the spin chuck 10A and to the waiting positions outside the cup 50A based on the control signal from the controller 60A, respectively.

Note that the acid solution etching unit 600B and the alkaline solution etching unit 600C are configured similarly to the hydrofluoric acid solution etching unit 600A except that those etching solutions are different, that is, the etching solution tank connected to the etching solution supply nozzle 6 is an acid solution tank or an alkaline solution tank in replace of the hydrofluoric acid solution tank 6b.

Next, a method of forming the coating film T in the substrate processing system will be described with reference to FIGS. 2A to 2C, FIG. 5, and FIGS. 12A to 12C through FIG. 15.

<In the Case of Etching with the Solvent for the Coating Film>

First of all, in the cassette station 1, the pair of tweezers 4 for wafer carriage accesses the cassette C housing unprocessed wafers W on the cassette mounting table 1a and takes out one wafer W from the cassette C (step S14-1). After taking out the wafer W from the cassette C, the pair of tweezers 4 for wafer carriage delivers the wafer W to a mounting table (not shown) in the first transfer unit TRS1 disposed in the first unit group G1 on the processing station 2 side (step S14-2). The first carrier arm 5A then receives the wafer W from the first transfer unit TRS1 and delivers the wafer W onto the cooling plate (not shown) in the first cooling unit COL1 disposed in the first unit group G1 to lower the temperature of the wafer W to 23° C. {pre-treatment cooling step: step S14-3}.

The first carrier arm 5A then receives the wafer W on the cooling plate in the first cooling unit COL1 and delivers the wafer W onto the spin chuck 10 in the first coating unit 100A. Thereafter, the coating solution is dropped (supplied) from the coating solution supply nozzle 30 onto the front surface of the wafer W rotating with the rotation of the spin chuck 10 as shown in FIG. 3A to form a coating film T with a level difference H on the front surface of the wafer W as in the first embodiment (see FIG. 2A) {first coating step: step S14-4}.

The first carrier arm 5A then receives the wafer W on the spin chuck 10 and delivers the wafer W onto the hot plate (not shown) in the first or second heating unit HP1 or HP2 in the first unit group G1. The wafer W is then heated for a heating time selected in advance from FIG. 5 to adjust the etching condition. This evaporates a part of liquid in the coating film T to slightly decrease the level difference in the coating film T as shown in FIG. 3B {first drying step: step S14-5}.

The first carrier arm 5A then receives the wafer W on the hot plate in the first or second heating unit HP1 or HP2 and delivers the wafer W onto the cooling plate in the first or second cooling unit COL1 or COL2 disposed in the first unit group G1 to lower the temperature of the wafer W to 23° C. {first cooling step: step S14-6}.

The first carrier arm 5A then receives the wafer W on the cooling plate in the first or second cooling unit COL1 or COL2 and delivers the wafer W onto the spin chuck 10 in the second coating unit 100B. Thereafter, the solvent is dropped (supplied) from the solvent supply nozzle 40 onto the front surface of the wafer W rotating with the rotation of the spin chuck 10 as shown in FIG. 3D to isotropically etch the coating film T as in the first embodiment (see FIG. 2B) {etching step: step S14-7}. After the isotropic etching with the solvent, the solvent (etching solution) is shaken out.

After the etching treatment, the coating solution is dropped (supplied) from the coating solution supply nozzle 30 onto the front surface of the wafer W rotating with the rotation of the spin chuck 10 as shown in FIG. 3E to form a substantially flat coating film T with a small level difference h within an allowable range on the front surface of the wafer W as in the first embodiment (see FIG. 2C) {second coating step: step S14-8}.

After the coating film is formed as described above, the first carrier arm 5A then receives the wafer W on the spin chuck 10 and delivers the wafer W onto the hot plate (not shown) in the third or fourth heating unit HP3 or HP4 disposed in the first unit group G1. The coating film is cured (baked) as shown in FIG. 3F {second drying step: step S14-9}.

After the curing (baking) treatment of the coating film T is performed as described above, the first carrier arm 5A receives the wafer W on the hot plate in the third or fourth heating unit HP3 or HP4 and delivers the wafer W onto the cooling plate in the second cooling unit COL2 to lower the temperature of the wafer W to 23° C. {second cooling step: step S14-10}.

The first carrier arm 5A then receives the wafer W on the cooling plate in the second cooling unit COL2 and delivers the wafer W onto the mounting table (not shown) in the second transfer unit TRS2 (step S14-11). The pair of tweezers 4 for wafer carriage then receives the wafer W on the mounting table in the second transfer unit TRS2 and houses (carries) the wafer W into the cassette C on the cassette mounting table 1a to end the processing (step S14-12).

Note that while a case in which a flat coating film is formed on the front surface of the wafer W with projections and depressions through the first coating step, the first drying step, the first cooling step, the etching step, the second coating step, the second drying step, and the second cooling step has been described in the above description, the second coating step and the second drying step may be repeatedly performed in order to further decrease the level difference in the coating film T. Alternatively, the first coating step, the first drying step, the first cooling step, the etching step, the second coating step, the second drying step, and the second cooling step may be repeatedly performed a plurality of times.

Further, when the first coating step, the first drying step, the first cooling step, the etching step, the second coating step, the second drying step, and the second cooling step are repeatedly performed a plurality of times, the wafer W for which treatments for the first time have been finished is not returned to the cassette station 1, but the wafers W on the mounting table in the second transfer unit TRS2 are temporarily housed in the buffer unit 700 in sequence by the first carrier arm 5A, so that after the first treatment for the first time for the last wafer W in a lot is finished, treatments for the second time for the wafers W sequentially carried out of the buffer unit 700 by the first carrier arm 5A are performed.

Besides, while a case in which the supply nozzle 40 for the solvent being the etching solution is disposed in each of the coating units 100A and 100B so that the film forming treatment and the etching treatment of the coating film T are performed in each of the coating units 100A and 100B has been described in the above-described embodiments, a dedicated etching unit comprising a solvent supply nozzle may be separately provided to perform etching treatment separately from the coating units 100A and 100B. Accordingly, when such process is performed, the solvent supply nozzle 40 may not be provided in each of the coating units 100A and 100B.

<In the Case of Etching with Hydrofluoric Acid>

First of all, in the cassette station 1, the pair of tweezers 4 for wafer carriage accesses the cassette C housing unprocessed wafers W on the cassette mounting table 1a and takes out one wafer W from the cassette C (step S15-1). After taking out the wafer W from the cassette C, the pair of tweezers 4 for wafer carriage delivers the wafer W to the mounting table (not shown) in the first transfer unit TRS1 disposed in the first unit group G1 on the processing station 2 side (step S15-2). The first carrier arm 5A then receives the wafer W from the first transfer unit TRS1 and delivers the wafer W onto the cooling plate (not shown) in the first cooling unit COL1 disposed in the first unit group G1 to lower the temperature of the wafer W to 23° C. {pre-treatment cooling step: step S15-3}.

The first carrier arm 5A then receives the wafer W on the cooling plate in the first cooling unit COL1 and delivers the wafer W onto the spin chuck 10 in the first coating unit 100A. Thereafter, the coating solution is dropped (supplied) from the coating solution supply nozzle 30 onto the front surface of the wafer W rotating with the rotation of the spin chuck 10 as shown in FIG. 3A to form a coating film T with a level difference H on the front surface of the wafer W as in the first embodiment (see FIG. 2A) {first coating step: step S15-4}.

The first carrier arm 5A then receives the wafer W on the spin chuck 10 and delivers the wafer W onto the hot plate (not shown) in the first, second, or third heating unit HP1, HP2, or HP3 in the first unit group G1. The wafer W is heated for a heating time selected in advance from FIG. 5 to adjust the etching condition. This evaporates a part of liquid in the coating film T to slightly decrease the level difference in the coating film T {first drying step: step S15-5}.

The first carrier arm 5A then receives the wafer W on the hot plate in the first, second, or third heating unit HP1, HP2, or HP3 and delivers the wafer W onto the cooling plate (not shown) in the second cooling unit COL2 disposed in the first unit group G1 to lower the temperature of the wafer W to 23° C. {first cooling step: step S15-6}.

The first carrier arm 5A then receives the wafer W on the cooling plate in the second cooling unit COL2 and delivers the wafer W onto the mounting table (not shown) in the third transfer unit TRS3 disposed in the second unit group G2. The second carrier arm 5B then receives the wafer W on the mounting table in the third transfer unit TRS3 and delivers the wafer W on the spin chuck 10A in the hydrofluoric acid solution etching unit 600A. Thereafter, the hydrofluoric acid solution is dropped (supplied) being the etching solution from the etching solution supply nozzle 6 onto the front surface of the wafer W rotating with the rotation of the spin chuck 10A to isotropically etch the coating film T (see FIG. 2B) {hydrofluoric acid solution etching: step S15-7}. In this event, pure water is supplied from the cleaning solution supply nozzle 7 to suppress (stop) the etching. After the isotropic etching with the hydrofluoric acid solution, the hydrofluoric acid solution (etching solution) is shaken out {shaking-out drying step: step S15-8}. In this event, the centrifugal force caused by the rotation of the spin chuck 10A driven by the motor 12 and the wafer W is used to remove the hydrofluoric acid solution served for the etching, and the drying gas, for example, a $N_2$ gas is supplied (jetted) from the drying gas supply nozzle 8, which horizontally scans from the position above the center of the wafer toward the peripheral portion, onto the front surface of the wafer W to blow the hydrofluoric acid solution served for etching to the outside to thereby remove it.

After the etching treatment, the second carrier arm 5B receives the wafer W on the spin chuck 10A in the hydrofluoric acid solution etching unit 600A and delivers the wafer W onto, for example, the mounting table (not shown) in the fourth transfer unit TRS4 disposed in the second unit group G2. The second carrier arm 5B then receives the wafer W on the mounting table in the fourth transfer unit TRS4 and delivers the wafer W on the cooling plate (not shown) in the third or fourth cooling unit COL3 or COL4 disposed in the second unit group G2 to lower the temperature of the wafer W, which will be subjected to coating treatment, to 23° C. {pre-treatment cooling step: step S15-9}.

The first carrier arm 5A then receives the wafer W on the cooling plate in the third or fourth cooling unit COL3 or COL4 and delivers the wafer W onto the spin chuck 10 in the second coating unit 100B. Thereafter the coating solution is dropped (supplied) from the coating solution supply nozzle 30 onto the front surface of the wafer W rotating with the rotation of the spin chuck 10 to form an almost flat coating film T with a small level difference h within an allowable range on the front surface of the wafer W (see FIG. 2C) {second coating step: step S15-10}.

After the coating film is formed as described above, the first carrier arm 5A receives the wafer W on the spin chuck 10 and delivers the wafer W onto the hot plate (not shown) in the fifth, sixth, or seventh heating unit HP5, HP6, or HP7 disposed in the second unit group G2. The coating film is then cured (baked) {second drying step: step S15-11}.

After the curing (baking) treatment of the coating film T is performed as described above, the first carrier arm 5A receives the wafer W on the hot plate in the fifth, sixth, or seventh heating unit HP5, HP6, or HP7 and delivers the wafer W onto the cooling plate (not shown) in the second cooling unit COL2 in the first unit group G1 to lower the temperature of the wafer W to 23° C. {second cooling step: step S15-12}.

The first carrier arm 5A then receives the wafer W on the cooling plate in the second cooling unit COL2 and delivers the wafer W onto the mounting table (not shown) in the second transfer unit TRS2 (step S15-13). The pair of tweezers 4 for wafer carriage then receives the wafer on the mounting table in the second transfer unit TRS2 and houses the wafer W into the cassette C on the cassette mounting table 1a to end the processing (step S15-14).

While a case in which a flat coating film is formed on the front surface of the wafer W with projections and depressions through the first coating step, the first drying step, the first cooling step, the hydrofluoric acid solution etching step, the second coating step, the second drying step, and the second cooling step has been described in the above description, the second coating step and the second drying step may be repeatedly performed as in the above description in order to further decrease the level difference in the coating film T. Alternatively, the first coating step, the first drying step, the first cooling step, the hydrofluoric acid solution etching step, the second coating step, the second drying step, and the second cooling step may be repeatedly performed a plurality of times.

Further, when the first coating step, the first drying step, the first cooling step, the hydrofluoric acid solution etching step, the second coating step, the second drying step, and the second cooling step are repeatedly performed a plurality of times, the wafer W for which treatments for the first time have been finished is not returned to the cassette station 1, but the wafers W on the mounting table in the second transfer unit TRS2 are temporarily housed in the buffer unit 700 in sequence by the first carrier arm 5A, so that after the treatment for the first time in the first treatment unit, for example, the cooling unit, for the last wafer W in a lot is finished, treatments for the second time for the wafers W sequentially carried out of the buffer unit 700 by the first carrier arm 5A are performed.

Note that while a case in which the etching solution is the hydrofluoric acid solution has been described in the above description, if an acid solution or an alkaline solution is used in place of the hydrofluoric acid solution to perform etching treatment, the wafer W having the coating film T formed thereon can be carried to the acid solution etching unit 600B or the alkaline solution etching unit 600C in place of the carriage flow to the hydrofluoric acid solution etching unit 600A.

According to the present invention, it is also possible that when the treatments are repeatedly performed a plurality of times, for example, the treatments can be performed with the etching conditions being selectively changed according to the condition of the SOG film thickness, such that the etching for the first time is performed using the hydrofluoric acid solution and the etching for the second time is performed using the acid solution or the alkaline solution, or the etching for the first time is performed using the alkaline solution and the etching for the second time is performed using the acid solution or the like, in addition to the case in which the etching conditions are changed by the etching time.

Note that while a case in which the coating solution is the SOG solution has been described in the above embodiments, the film formation technology according to the present invention is also applicable to the coating solution other than the SOG solution, such as a resist, and is also applicable to a substrate other than the wafer W, such as an LCD substrate as a matter of course.

What is claimed is:

1. A substrate treatment method for forming a coating film on a substrate with projections and depressions on a front surface thereof, comprising:
   a first coating step of supplying a coating solution to the substrate with projections and depressions on the front surface thereof to form a coating film on the front surface of the substrate;
   a first drying step of heating the substrate having the coating film formed thereon to adjust an etching condition of the coating film;
   an etching step of supplying an etching solution for etching the coating film formed on the substrate to etch the coating film;
   a second coating step of supplying the coating solution to the substrate to form a flat coating film on the front surface of the substrate; and
   after said second coating step, a second drying step of heating the substrate to cure the coating film,
   wherein, when said first coating step, first drying step, etching step, second coating step, and second drying step are repeatedly performed, a plurality of the substrates for which treatments for the first time have been finished are temporarily housed in a buffer unit in sequence, and after said first coating step for the last substrate in a lot is finished, treatments for the second time for the substrates sequentially carried out of the buffer unit are started.

2. The substrate treatment method as set forth in claim 1, further comprising:
   after each of said first drying step and second drying step, a cooling step of cooling the substrate.

3. The substrate treatment method as set forth in claim 1, wherein in said first and second coating steps, the coating solution is supplied to the front surface of the substrate with the substrate being horizontally rotated, and wherein in said etching step, the etching solution is supplied to the front surface of the substrate with the substrate being horizontally rotated.

4. The substrate treatment method as set forth in claim 1, wherein in said first drying step and second drying step, the substrate is horizontally rotated, and a drying gas is supplied to the substrate.

5. The substrate treatment method as set forth in claim 1, wherein the etching solution is adjusted in temperature to a predetermined temperature.

6. The substrate treatment method as set forth in claim 1, wherein the etching solution is adjusted in concentration to a predetermined concentration.

7. The substrate treatment method as set forth in claim 1, wherein the etching solution is one of a solvent for the coating solution, a hydrofluoric acid solution, an acid solution and an alkaline solution.

8. A substrate treatment method for forming a coating film on a substrate with projections and depressions on a front surface thereof, comprising:
   a first coating step of supplying a coating solution to the substrate with projections and depressions on the front surface thereof to form a coating film on the front surface of the substrate;
   a first drying step of heating the substrate having the coating film formed thereon to adjust an etching condition of the coating film by adjusting a heating time;
   an etching step of supplying an etching solution for etching the coating film formed on the substrate to etch the coating film;
   a second coating step of supplying the coating solution to the substrate to form a flat coating film on the front surface of the substrate; and
   after said second coating step, a second drying step of heating the substrate to cure the coating film,
   wherein, when said first coating step, first drying step, etching step, second coating step, and second drying step are repeatedly performed, in said each of etching step, different kinds of etching solutions are supplied.

* * * * *